(12) United States Patent
Bayraktaroglu et al.

(10) Patent No.: US 6,529,063 B1
(45) Date of Patent: Mar. 4, 2003

(54) THERMALLY STABLE CASCODE

(75) Inventors: Burhan Bayraktaroglu, Millersville, MD (US); Mike L. Salib, Millersville, MD (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 08/870,406

(22) Filed: Jun. 6, 1997

(51) Int. Cl.[7] .............................................. H01L 35/00
(52) U.S. Cl. ........................ 327/513; 327/482; 327/484
(58) Field of Search ................................ 327/482–492, 327/512, 513, 89

(56) References Cited

U.S. PATENT DOCUMENTS

| 4,572,967 | A | * | 2/1986 | Metz ........................... 327/482 |
| 5,252,841 | A | | 10/1993 | Wen et al. .................. 257/197 |
| 5,321,279 | A | | 6/1994 | Kmatibzadeh .............. 257/197 |
| 5,378,922 | A | | 1/1995 | Sovero ........................ 257/582 |
| 5,389,554 | A | | 2/1995 | Liv et al. ...................... 437/31 |
| 5,497,155 | A | * | 3/1996 | Izuhara ......................... 327/89 |
| 5,569,944 | A | | 10/1996 | Delaney et al. ............. 257/198 |
| 5,608,353 | A | | 3/1997 | Pratt ............................ 330/295 |
| 5,616,950 | A | | 4/1997 | Liv .............................. 257/469 |

OTHER PUBLICATIONS

Liou et al., "Thermal Stability Analysis of AlGaAs/GaAs Heterojunction Bipolar Transistorw With Multiple Emitter Fingers", IEEE Trans.Electron Dev., vol. 41, No. 5., pp. 629–630, 1994.

Liu et al., "The Collapse of Current Gain in Multi–Finger Heterojunction Bipolar Transistors, Its Substrate Temperature Dependoence, Instability Criteria, and Modeling", IEEE Trans Electron Dev., vol. 41, No. 10, pp. 1698–1707, 1994.

Gao et al., "Emitter Ballasting Resistor Design for, and Current Hanoling Capability of AlGaAs/GaAs Power Heterojunction Bipolar Transistors", IEEE Trans. Electron Dev., vol. 38, No. 2, pp. 185–196, 1991.

Liu et al., "The Use of Base Ballasting to Prevent the Collapse of Current Gain in AlGaAs/GaAs Heterojunction Bipolar Transistors", IEEE Trans. Electron Dev., vol. 43, No. 2, pp. 245–251, 1996.

Bayraktaroglu, et al. "Very High Power Density CW Operation of AlGaAs/GaAs Microwave Heterojunction Bipolar Transistors", IEEE Electron Dev. Lett., vol. 14, No. 10, pp. 493–495, 1993.

* cited by examiner

Primary Examiner—Kenneth B. Wells
(74) Attorney, Agent, or Firm—John J. Karasek; John G. Mills, III

(57) ABSTRACT

A thermally stabilized cascode heterojunction bipolar transistor (TSC-HB) having the current and power generation regions in separate temperature zones, each transistor collector in a cold zone connected directly and individually to an emitter terminal of a corresponding transistor in a hot zone, thereby limiting the current available to the emitter of the transistor in the hot zone. Such an interconnection of transistors prevents the transistor in the hot zone from drawing more current from other transistor sources when increases in temperature occur. This achieves thermal stability and prevents the transistors from overheating and burning out.

6 Claims, 3 Drawing Sheets

THERMALLY STABLE CASCODE

BACKGROUND OF THE INVENTION

1. Field of the Invention

This invention refers generally to bipolar transistors and more specifically to a thermally stable cascode heterojunction bipolar transistor fabricated on GaAs or other III-V compound semiconductors being used as active devices in microwave and high speed digital circuits.

2. Description of the Related Art

High power microwave heterojunction bipolar transistors (HBT) exhibit thermal instability, or thermal runaway, related to failures when operated under large direct current (dc) or radio frequency (RF) drive conditions. The basic cause of this instability is the negative temperature coefficient of the emitter-base turn-on voltage and the strong electrothermal feedback in devices with moderate to high thermal resistances. When a multi-finger HBT is biased from a single base voltage, as shown in FIG. 1, the electrothermal feedback can cause one of the emitter fingers to conduct most of the available current to the whole device and therefore create a "hot spot."

Thermal instability in HBTs can be reduced by the use of ballast resistors in series with each emitter or base finger, or by thermal-shunt techniques. See, G, B. Gao et al., *Emitter Ballasting Resistor Design for, and Current Handling Capability of AlGaAs/GaAs Power Heterolunction Bipolar Transistors,* IEEE Trans. Electron Dev., Vol. 38, pp. 185–196, 1991; W. Liu et el., *The Use of Base Ballasting to Prevent the Collapse of Current Gain in AlGaAs/GaAs Heterolunction Bipolar Transistors,* IEEE Trans. Electron. Dev., Vol. 43, pp. 245–251. 1996; B. Bayraktaroglu et al., *Very High Power Density CW Operation of AlGaAs/GaAs Microwave Heterojunction Bipolar Transistors,* IEEE Electron. Dev., Vol. 14, pp. 493–495, 1993. The stability achieved with ballast resistors usually come at the expense of reduced microwave performance, such as microwave gain and power-added efficiency (PAE). The reduction in power gain due to ballast resistors is especially undesirable at X-band and higher frequencies, where the power gain is already limited. PAE above 50% is more difficult to achieve at these frequencies, since the higher efficiency amplifier modes require high external device transconductance. Further, emitter ballast resistors can cause an increase in the "knee voltage", which limits RF voltage swing amplitude and therefore PAE. Thermal shunt technique does not have the disadvantages associated with ballast resistors, and have demonstrated very high power density operation at 10 GHz with good PAE. However, thermal shunt HBTs have only marginal robustness under strong RF drive conditions.

In the prior art or conventional device, FIG. 1, the base current component of each subcell or transistor is a function of the local temperature. The local temperature, which is influenced by the power consumed in each subcell, is proportional to the collector current component. Because the temperature dependent current regulator (e-b junction) and the temperature generator (b-c junction) are in the same physical location, a strong positive electrothermal feedback exists.

The cascode operation of HBTs itself is not a new approach. Previously cascode HBT amplifiers were designed where common-emitter (CE) unit cells drive a common-base (CB) unit-cells of identical sizes. In this ordinary use of the cascode configuration multiple emitter CE cells provide the current for a similar sized multiple emitter CB cells. Therefore, the thermal instability is not eliminated. The present invention eliminates the thermal instability of HBTs by the use of a conceptually new cascode design.

SUMMARY OF THE INVENTION

The object of this invention is to produce a heterojunction bipolar transistor (HBT) having a high power gain and efficiency at microwave and millimeter wave frequencies while maintaining unconditional thermal stability, and provide robustness to electrical overstress (EOS).

These and other objectives are attained in the thermally stabilized cascode heterojunction bipolar transistor (TSC-HBT) by placing the current and power generation regions into separate temperature zones, thereby achieving thermal stability.

DESCRIPTION OF THE PREFERRED EMBODIMENTS

This invention describes a device for achieving thermal stability in heterojunction bipolar transistors (HBT) by using cascode bias configuration. In the thermally stabilized cascode heterojunction bipolar transistor (TSC-HBT) 10, FIG. 2, thermal runaway conditions are prevented by placing the current and power generation regions into separate temperature zones. In this invention the subcell is the lowest building block. A cell or stage can be either a common-emitter (CE) or common-base (CB), and contain subcells. The transistor is the cascode (TSC-HBT). This is unlike the conventional cascode designs where the collector current of the entire common-emitter (CE) cell is connected to the emitter of the entire common-base (CB) cell, the connection is made at the subcell level in a TSC-HBT 10.

Figure 1:
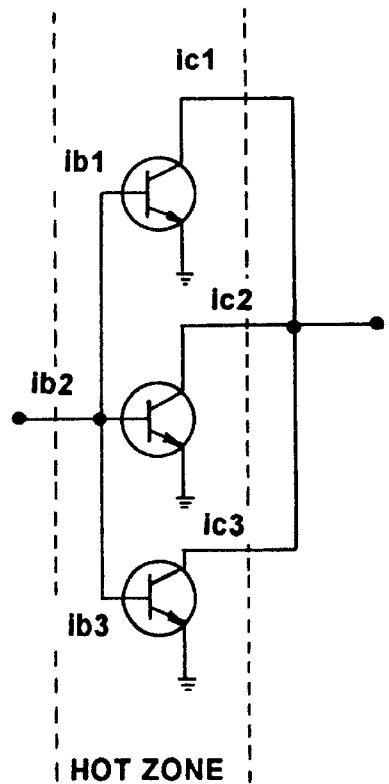
FIG. 1 shows the prior art where all terminals of the subcells are connected so as to form a transistor with a potential thermal instability.
Figure 2:
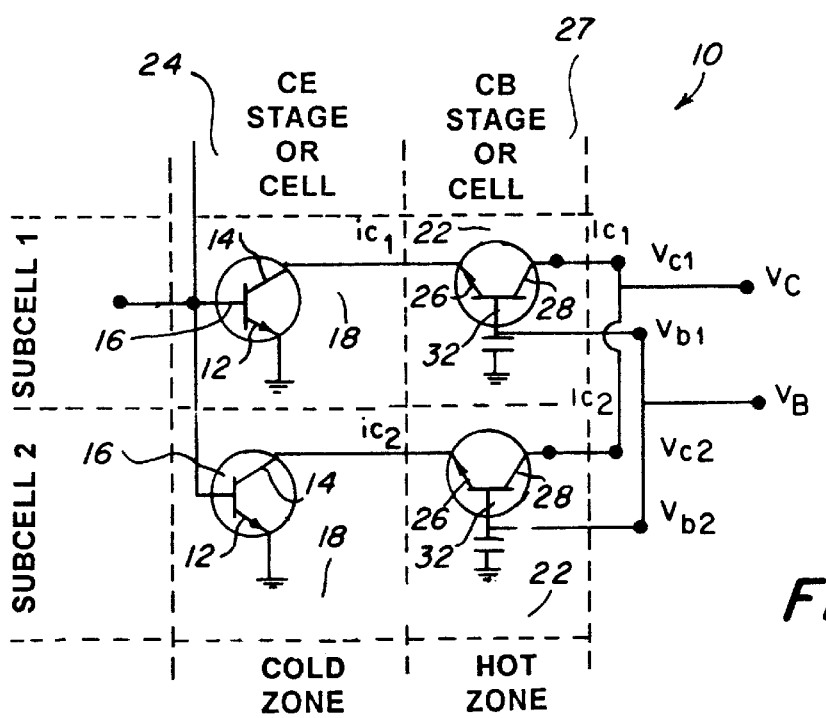
FIG. 2 shows the electrical circuit of a thermally stable cascode heterojunction bipolar transistor (TSC-HBT) utilizing n-p-n transistors where the collector current of each common-emitter (CE) subcell is individually connected to the emitter of the corresponding common-base (CB) subcell.
Figure 5:
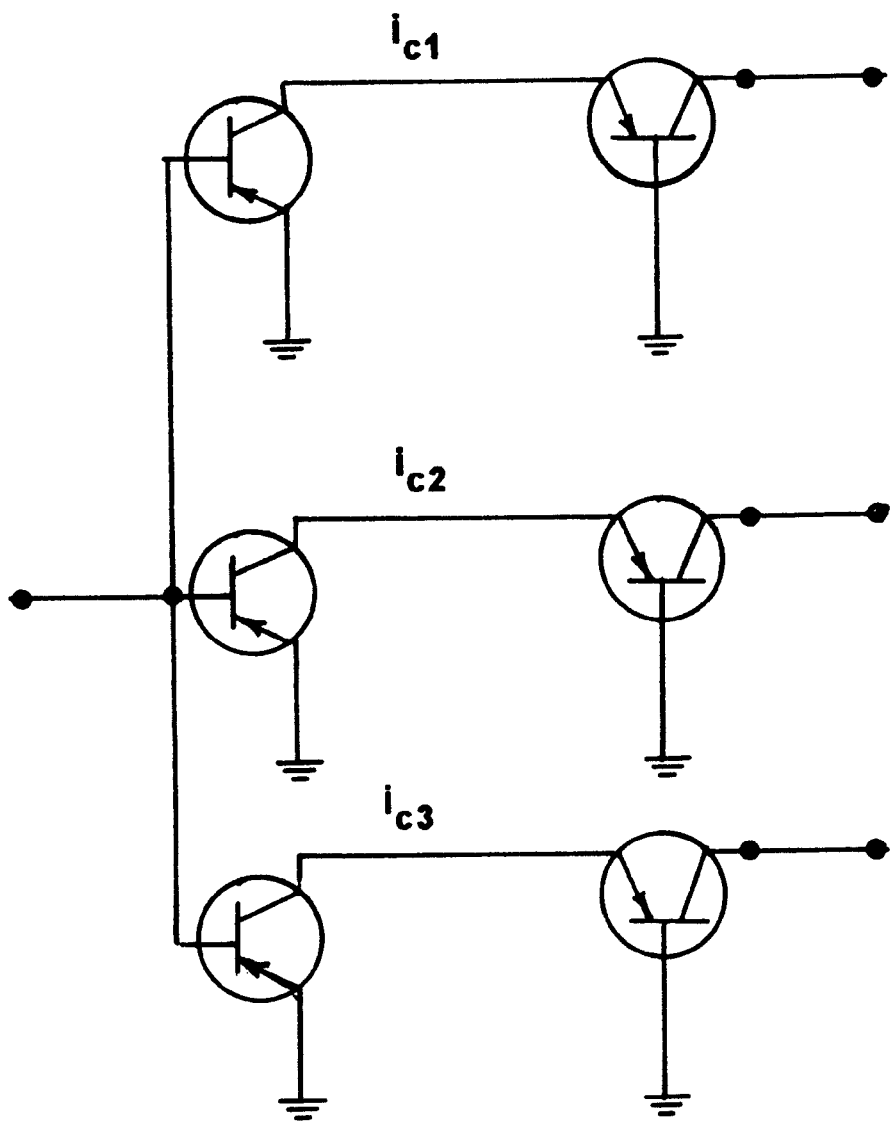
FIG. 5 shows an electrical circuit of a thermally stable heterojunction bipolar transistor (TSC-HBT) utilizing a p-n-p transistor.

The TSC-HBT 10, as shown in FIG. 2, is comprised of emitters 12 and 26, collectors 14 and 28, and bases 16 and 32, is fabricated using known processing methods and may be either a p-n-p (as shown in FIG. 5) or or a n-p-n type (as shown in FIG. 2). In the preferred embodiment of the present invention, each emitter 26, of the CB subcell 22 is provided with a separate current source from the CE stage 24, a stage being defined as the equivalent of all subcells 18 and 22. The current level in each emitter 26 of the CB cell or stage 27 is regulated by the CE cell or stage 24 by direct connection of the CE collector 14 current of subcell 18 to the emitter 26 of the CB subcell 22. In a typical operation, the CE stage 24 is biased with low collector bias (1–3 V) since this bias is only needed to turn on the CE stage 24 and provide constant collector current. Because of this low bias condition, the CE stage 24 have a junction temperature too low to cause thermal runaway ($\Delta \equiv 20°$ C.). Therefore, the temperature in the CE stage 24 is uniform. A uniform temperature in the CE cell 24 produces uniform current levels at the collector 14 of the CE stage 24. This uniform current is distributed to the CB subcell 22 as the emitter 26 current. The current to each emitter 26 is therefore regulated individually by the CE stage 24. Because the collector 28 bias is substantially higher in the CB cell 28 compared to the CE cell 24 (>5X), the junction temperature is higher in the CB stage 27. Even though temperature variations may exist between the emitter fingers 26 of the CB cell 27, no thermal runaway can occur since the current of each emitter finger 26 is limited. Although the preferred embodiment has been described in the terms of two subcells 18 and 22, with a single subcell 18 or 22 as the basic building block of the device, a multiple (2–500) subcells are used in practice.

For the TSC-HBT 10, the CE stage 24, which can be referred to as the cold zone, is the current regulator, which is kept at a low temperature zone ($\Delta T=20°$ C.) since it is biased at a low collector 14 voltage (1–3 V). In effect, $i_{c1}=i_{c2}$ condition is maintained, where $i_{c1}$ is $\beta I_{bs1}$ and $i_{c2}$ is $\beta I_{b2}$, where $\beta$ is the current gain, $I_{b1}$ and $I_{b2}$ are the base currents of each subcell. The CB stage 27, which is located in the hot zone and is responsible for power generation, maintains a uniform temperature profile since $i_{c1}=i_{c2}$ and $I_c=\alpha i_c$, where IC is the collector current in the CB stage 27 and $\alpha$ is the CB stage 27 current gain. The thermal runaway condition is avoided because the positive thermal feedback is eliminated between the current regulator (CE stage 24) and the power generator (CB stage 27). The two parts of the device are kept at two separate temperature zones. Any residual heat transfer from one part to the other is controlled by the cell design.

Figure 3:
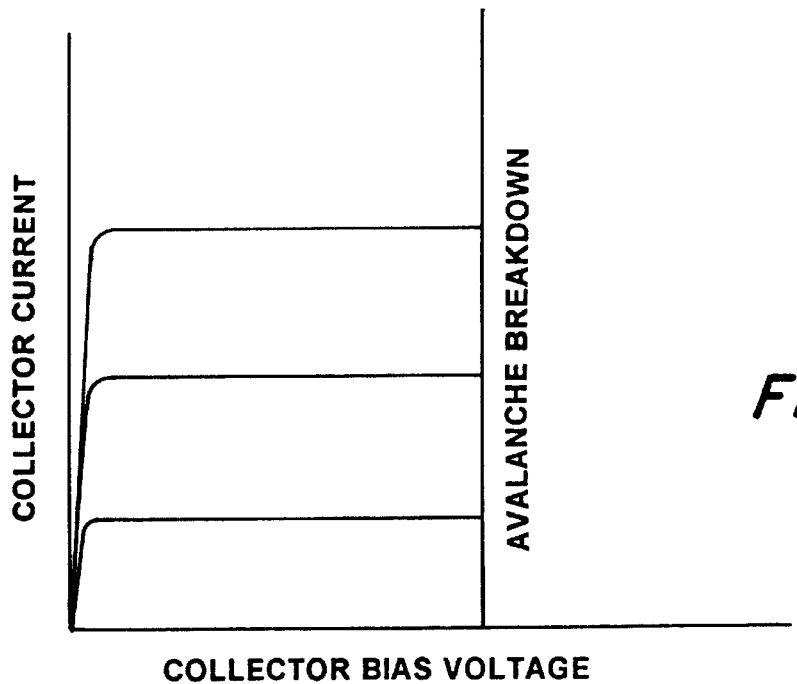
FIG. 3 shows the measured characterictics of a TSC-HBT.
Figure 4:
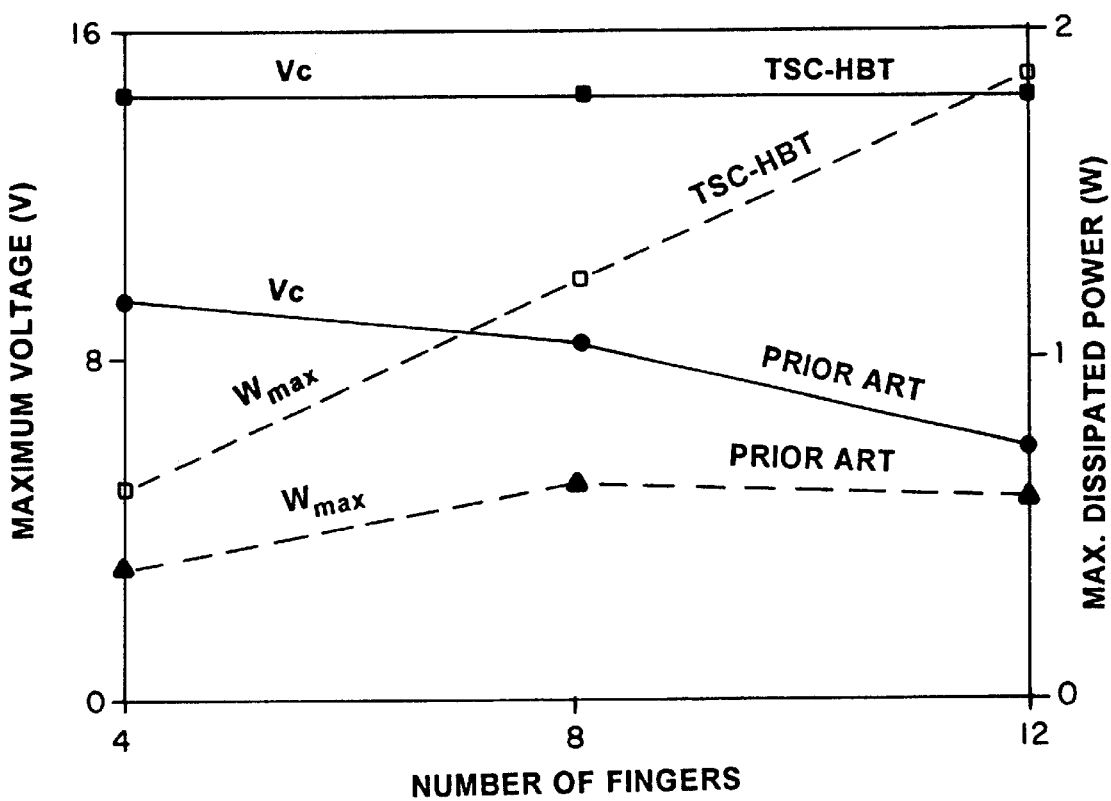
FIG. 4 shows the experimentally obtained maximum voltage and power dissipation as a function of cascode cell size, comparing the performance of the prior art and the preferred embodiment.

A direct comparison of the prior art and the TSC-HBT cells was made by measuring the maximum collector voltage, V, that could be applied at 41 kA/cm² current density on device fabricated together. It was observed that the conventional cascode devices all had "current crunch" characteristics and burned out due to thermal runaway, whereas all TSC-HBT devices were free from these effects up to the avalanche breakdown voltage at 14.5 V, as shown in FIG. 3. The maximum voltage, $V_{max}$, in volts. (i.e., the voltage at the onset of thermal runaway at 41 kA/cm² current density) shows an inverse relationship with the number of fingers contained in the cell for the conventional device, as shown in FIG. 4. The TSC-HBT had voltage values independent of the number of emitter fingers. Maximum power, in watts, $P_{max}$, was calculated by multiplying the maximum voltage across the CB subcell 22 and the collector 28 current, i.e., $P_{max}=(V_{max}-V_{b2})*I_c$, where $V_{b2}$ is the voltage applied to base 32 of CB subcell 22 and $I_c$ is the collector 26 current of the CB subcell 22. It is seen that $P_{max}$ value for the prior art device designs saturates at about 0.65 W as the number of emitter fingers 12 and 26 are increased from four to twelve, whereas a monotonic increase is seen for the TSC-HBT. The power handling capability of the twelve finger TSC-HBT is 300% higher than the prior art cascode HBT fabricated on the same wafer for 12-emitter cascode HBT. An even higher ratio is expected as larger devices are compared. The microwave performance of both the cascode types was identical.

In summary. it is demonstrated that TSC-HBTs can prevent thermal runaway conditions by individually regulating the emitter current of subcells in a power unit-cell. A direct comparison of devices fabricated on the same wafer shows that TSC-HBTs can dissipate 300% or more power than conventional devices by eliminating the negative electrochemical feedback effects.

Although the invention has been described in relation to an exemplary embodiment thereof, it will be understood by those skilled in the art that still other variations and modifications can be affected in this preferred embodiment without detracting from the scope and spirit of the invention as described in the claims.

What is claimed is:

1. A device for controlling thermal runaway in heterojunction bipolar transistors (HBT) comprising:
   a common-emitter cell and a common-base cell;
   each cell having a first subcell and a second subcell;
   said first and second subcell of the common-emitter cell having at least one transistor in each subcell;
   said first and second subcell of the common-base cell having at least one transistor in each subcell;
   each transistor of the subcells in the common-emitter cell and common-base cell further comprising an emitter, a collector and a base;
   said device having power generation and current generation regions in separate temperature zones;
   said transistor collectors in a cold zone being connected directly to emitter terminals of corresponding transistors in a hot zone, thereby substantially preventing said transistors in the hot zone from drawing more current from other transistor sources when temperature increases occur and preventing said transistors from overheating and burning out.

2. A device as in claim 1, wherein the transistors are gallium-arsenide transistors.

3. A device as in claim 1, wherein the transistors are p-n-p transistors.

4. A device as in claim 1, wherein the transistors are n-p-n transistors.

5. A device for controlling thermal runaway in heterojunction bipolar transistors (HBT) comprising:
   a common-emitter cell having a plurality of subcells;
   a common-base cell having a plurality of subcells;
   each subcell of the common-emitter cell and the common-base cell further comprising an emitter, a collector and a base; and the collector in each subcell in the common-emitter cell being connected to the emitter of at least one subcell in the common-base cell in the line of current flow so as to eliminate a positive thermal feedback between the common-emitter cell and the common-base cell thereby preventing thermal runaway;
   said device having power generation and current generation regions in separate temperature zones;
   said transistor collectors in a cold zone being connected directly to emitter terminals of corresponding transistors in a hot zone, thereby substantially preventing said transistors in the hot zone from drawing more current from other transistor sources when temperature increases occur and preventing said transistors from overheating and burning out.

6. A device for controlling thermal runaway in heterojunction bipolar transistors (HBT) comprising:
   a common-emitter cell having at least one subcell;
   a common-base cell having at east one subcell;
   said subcells being further comprising an emitter, a collector and a base;
   said device having power generation and current generation regions in separate temperature zones;
   said transistor collectors in a cold zone being connected directly to emitter terminals of corresponding transistors in a hot zone, thereby substantially preventing said transistors in the hot zone from drawing more current from other transistor sources when temperature increases occur and preventing said transistors from overheating and burning out.

* * * * *

UNITED STATES PATENT AND TRADEMARK OFFICE
CERTIFICATE OF CORRECTION

PATENT NO.    : 6,529,063 B1
DATED         : March 4, 2003
INVENTOR(S)   : Bayraktaroglu et al.

It is certified that error appears in the above-identified patent and that said Letters Patent is hereby corrected as shown below:

<u>Title page,</u>
Item [74], *Attorney, Agent or Firm*, "John G. Mills, III" should read -- John Gladstone Mills III --

Signed and Sealed this

Sixth Day of July, 2004

JON W. DUDAS
*Acting Director of the United States Patent and Trademark Office*